(12) United States Patent
Testin et al.

(10) Patent No.: US 10,473,727 B2
(45) Date of Patent: Nov. 12, 2019

(54) EARLY POWER FAILURE DETECTION CIRCUIT

(75) Inventors: William John Testin, Indianapolis, IN (US); Brian Albert Wittman, Indianapolis, IN (US)

(73) Assignee: INTERDIGITAL CE PATENT HOLDINGS, Paris (FR)

( * ) Notice: Subject to any disclaimer, the term of this patent is extended or adjusted under 35 U.S.C. 154(b) by 856 days.

(21) Appl. No.: 14/408,070

(22) PCT Filed: Jun. 15, 2012

(86) PCT No.: PCT/US2012/042588
§ 371 (c)(1),
(2), (4) Date: Dec. 15, 2014

(87) PCT Pub. No.: WO2013/187908
PCT Pub. Date: Dec. 19, 2013

(65) Prior Publication Data
US 2015/0142346 A1 May 21, 2015

(51) Int. Cl.
*G01R 31/40* (2014.01)
*G01R 19/165* (2006.01)
*G01R 21/00* (2006.01)

(52) U.S. Cl.
CPC ....... *G01R 31/40* (2013.01); *G01R 19/16547* (2013.01); *G01R 21/00* (2013.01)

(58) Field of Classification Search
CPC ... G01R 31/40; G01R 19/16547; G01R 21/00
(Continued)

(56) References Cited

U.S. PATENT DOCUMENTS

| 4,031,463 A | 6/1977 | Norberg |
| 4,713,553 A | 12/1987 | Townsend et al. |

(Continued)

FOREIGN PATENT DOCUMENTS

| EP | 0163282 A2 | 12/1985 |
| WO | 99/30173 A1 | 6/1999 |

OTHER PUBLICATIONS

Search Report dated Mar. 3, 2013.
(Continued)

*Primary Examiner* — Yoshihisa Ishizuka
(74) *Attorney, Agent, or Firm* — Jerome G. Schaefer; Shabtay Henig

(57) ABSTRACT

Early power failure (EPF) detection circuit applies a rectified, unfiltered periodic waveform, at the frequency of the mains supply voltage to a threshold detector. During each cycle of the periodic waveform, the threshold detector produces a pulse voltage having a leading edge when the periodic waveform begins to exceed a threshold level associated with the threshold detector and a trailing edge when the periodic waveform ceases to exceed the threshold voltage. A microprocessor measures the length of the interval between the leading and trailing edges for indirectly measuring the magnitude (for example, RMS or peak) of the mains supply voltage. When the indirectly measured magnitude decreases below a minimum permissible, second threshold magnitude, a controlled power shutdown of the apparatus is initiated, such as by, for example, programs interrupt routine in the microprocessor.

7 Claims, 2 Drawing Sheets

(58) Field of Classification Search
USPC .......................................................... 702/60
See application file for complete search history.

(56) References Cited

U.S. PATENT DOCUMENTS

| | | | |
|---|---|---|---|
| 6,208,258 B1 | 3/2001 | Redilla | |
| 6,683,392 B2 | 1/2004 | Testin et al. | |
| 7,741,828 B2 | 6/2010 | Wittman | |
| 8,084,893 B2 | 12/2011 | Fujii | |
| 2006/0072265 A1* | 4/2006 | Bucella | H02J 13/0096 361/90 |
| 2009/0268488 A1 | 10/2009 | Fujii | |
| 2011/0305047 A1* | 12/2011 | Jungreis | H02M 1/08 363/21.02 |
| 2012/0032695 A1 | 2/2012 | Turchi et al. | |
| 2013/0328505 A1* | 12/2013 | Sadwick | H05B 39/041 315/307 |

OTHER PUBLICATIONS

Ramtron International Corp., "AN-400, Generating a Power-Fail Interrupt—Using the FM31xxx Power-Fail Comparator," 3 pages, retrieved from the Internet, Sep. 2003, http://www.ramtron.com.

* cited by examiner

US 10,473,727 B2

EARLY POWER FAILURE DETECTION CIRCUIT

FIELD OF THE INVENTION

This application claims the benefit, under 35 U.S.C. § 365 of International Application PCT/US2012/042588, filed Jun. 15, 2012, which was published in accordance with PCT Article 21(2) on Dec. 19, 2013 in English, which is incorporated by reference in its entirety.

BACKGROUND OF THE INVENTION

Personal video recorders, set-top boxes, personal computers, etc. typically employ various memory devices to store program and system information. Memory devices include hard disk drives, recordable disks, semiconductor memory devices and the like. Set-top boxes, for example, require a sufficient time to provide orderly shutdown such that data can be saved in a non-volatile memory such as Flash memory device before the supply voltage drops to such a low level that saving the data can no longer be accomplished.

AC power sources that power such devices can suffer from a variety of long-term and transient disturbances or power fail conditions. The term "power disturbance" or "power fail condition", as used herein, refers to a condition in which a magnitude of an AC input supply voltage is smaller than required to be within a normal range of values, a condition that might necessitate performing an orderly shutdown of the device.

In order to guarantee the necessary time for the orderly shutdown, a voltage that is indicative of the AC mains supply voltage is monitored. An early power fail (EPF) threshold voltage is chosen such that the magnitude of the AC mains supply voltage is higher than a minimum required to operate direct current (DC) power supplies in, for example, the set-top box. The set-top box DC power supplies have to remain active long enough after EPF threshold voltage is detected to enable sufficient time for performing orderly shutdown.

It might also be desirable to allow uninterrupted operation, during brown out conditions, when the AC voltage is too small to be within the normal tolerance or range but is greater than what the set-top box actually needs for uninterrupted normal operation.

In a prior art arrangement, a threshold detector provides an output signal indicating that the AC mains supply voltage has exceeded, during a portion of a given period of the AC mains supply voltage, a threshold magnitude. This situation is considered to be an undisturbed AC mains supply voltage. Conversely, the detector output signal would indicate a disturbance or power failure in the AC mains supply voltage, when the AC mains supply voltage exceeds the threshold magnitude, at no time throughout the entire period.

Typically an electrolytic capacitor is used to maintain sufficient amount of stored charge for use between the time the EPF threshold is detected and the time when the orderly shutdown is completed. Because of conditions such as tolerances, variation in thresholds due to loading, etc., either the EPF threshold voltage has to be set higher or a larger value electrolytic capacitor value has to be chosen than would be, otherwise, necessary. This has to be done so that orderly shutdown can be guaranteed under all such conditions.

In the prior art arrangement, there is a range of values of the AC mains supply voltage that will exceed, during a portion of a given period of the AC mains supply voltage, the threshold magnitude. Because the actual magnitude of the AC mains supply voltage is not measured, the threshold magnitude has to be set in a manner to meet the worst case condition. Consequently, the threshold magnitude has to be set, disadvantageously, at a higher value than if the actual magnitude of the AC mains supply voltage was measured and known. This requires the initiation of the shutdown routine when the magnitude of the AC mains supply voltage is, disadvantageously, higher than if the actual magnitude of the AC mains supply voltage was measured and known.

An EPF detection circuit, embodying an aspect of the invention, applies a rectified periodic waveform that is unfiltered with respect to the frequency of the AC mains supply voltage to a threshold detector. In contrast to the prior art, both when the magnitude (for example, RMS or peak) of the AC mains supply voltage is at an acceptable magnitude and also when a disturbance occurs, the inventive detector detects, during each period, a time when the increasing waveform crosses a threshold magnitude in a first direction and a time when the decreasing waveform crosses a threshold level in an opposite direction. A time measuring device, for example, a microprocessor, measures a length of an interval between threshold crossing times; alternatively, it calculates a duty cycle of an output signal of the threshold detector. Each of those results is indirectly indicative of a magnitude (for example, RMS or peak) of the mains supply voltage. A larger duty cycle or a longer length would be indicative of a higher magnitude and vice versa. Based on the result of the indirectly measured magnitude, the microprocessor can initiate and perform orderly controlled power shutdown of the apparatus by, for example, program interrupt routine. Because of the indirect measurement of the actual magnitude (for example, RMS or peak) of the AC mains supply voltage, the threshold magnitude for shutdown can be established at, advantageously, a lower magnitude of the AC mains supply voltage than required in the prior art. By accurately indirectly monitoring the magnitude of the AC mains supply voltage, the set-top box can continue uninterrupted operation with, advantageously, lower magnitudes of AC mains than would be required in the prior art power supply prior to initiating shutdown. It will also provide the flexibility to operate, for example, the set-top box during, advantageously, longer intervals of AC dropout, during which the disturbance occurs in only a limited number of periods of the AC mains supply voltage.

SUMMARY OF THE INVENTION

An apparatus, embodying an inventive feature, for generating an early power failure (EPF) indicative signal for an electronic device energized by an alternating current (AC) input mains voltage includes a threshold detector. The threshold detector is responsive to the AC input mains voltage for generating an output signal when, during a portion of a period of the AC input mains voltage, an instantaneous magnitude of the AC input mains voltage exceeds a threshold of the detector. The corresponding portion occurs both when the AC input mains voltage is within a normal operation range and when a power failure condition occurs in the AC input mains voltage. A processor measures a value indicative of a length of the portion period of the detector output signal for providing the EPF indication in accordance with the length indicative value.

DETAILED DESCRIPTION

Figure 1:
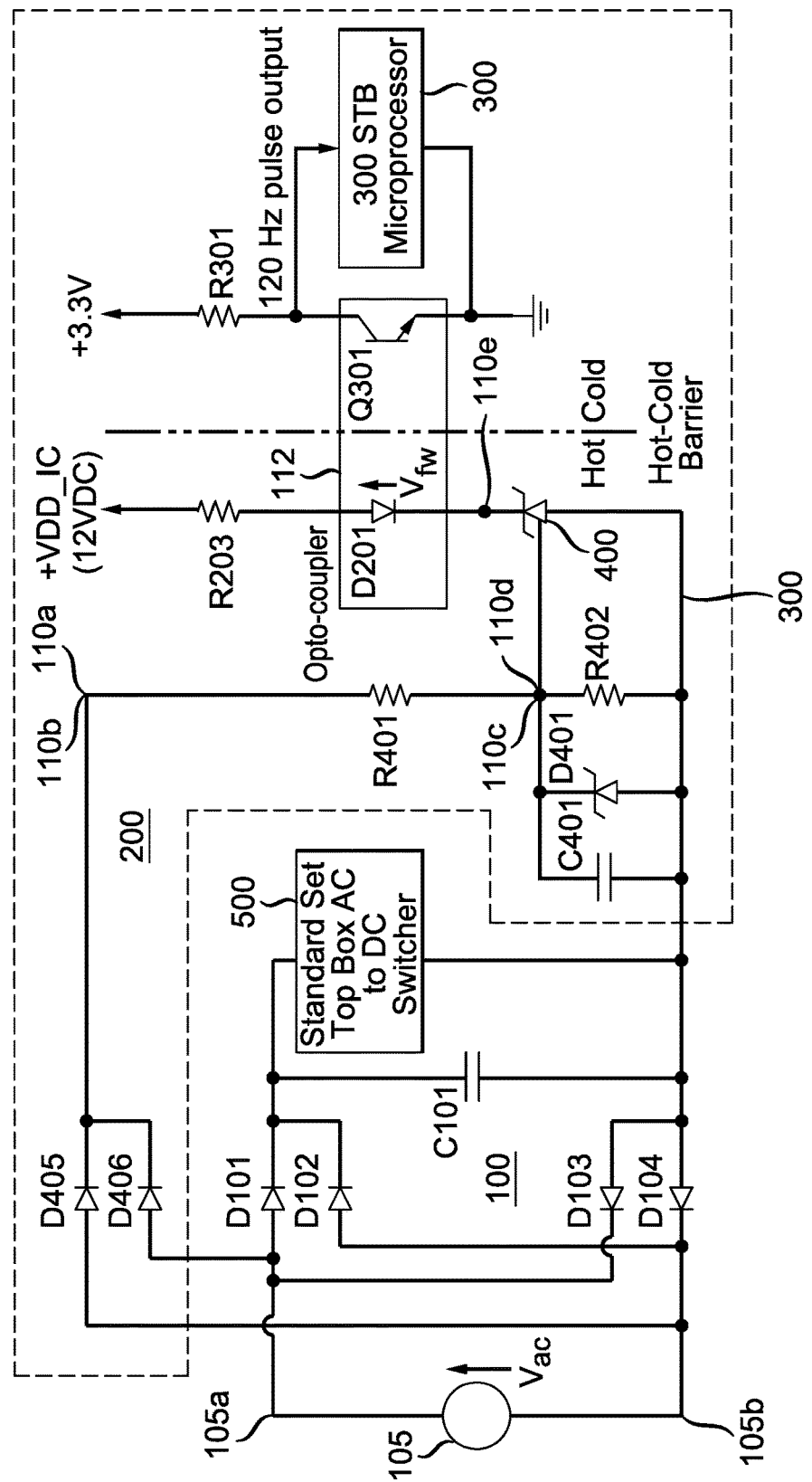
FIG. 1 illustrates partially in a block diagram form and partially in detailed schematic a power supply that energizes an electrical device and a power disturbance detection circuit according to an embodiment of the invention.

FIG. 1 illustrates partially in a block diagram form and parially in detailed schematic a power supply 100 that energizes an electrical device. It also illustrates a power disturbance or early power failure (EPF) detection circuit 200 according to an embodiment of the invention. EPF detection circuit 200 detects power disturbance in an alternating current (AC) mains supply voltage source 105 that provides an input supply voltage Vac to power supply 100.

Figure 2A:
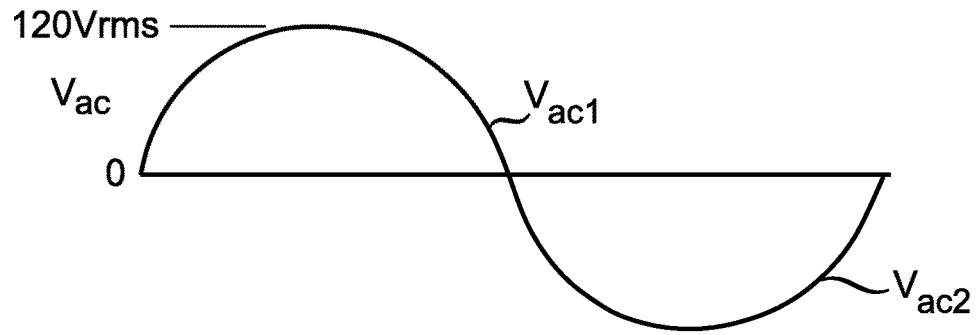
FIGS. 2a, 2b and 2c illustrate waveforms for explaining the operation of the power disturbance detection circuit of FIG. 1.
Figure 2B:
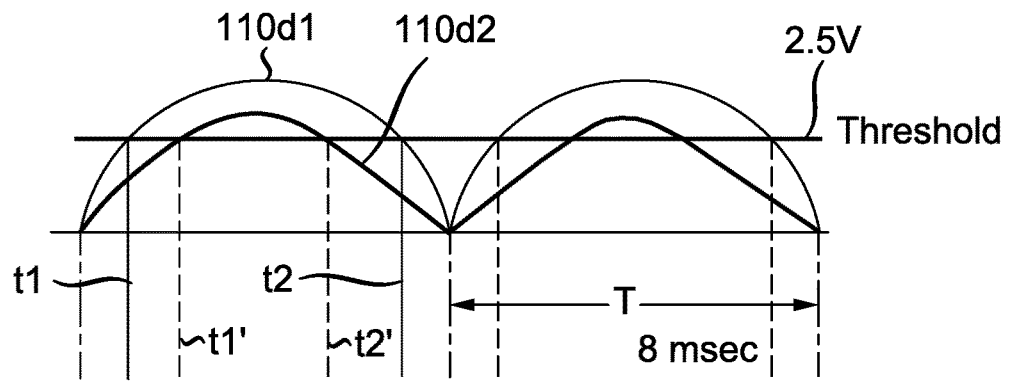
Figure 2C:
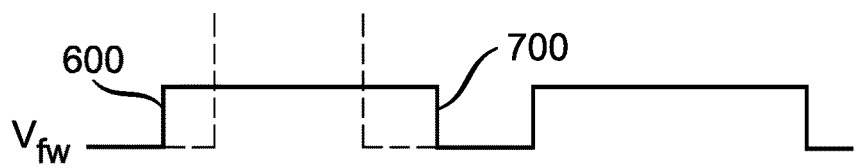

FIGS. 2a, 2b and 2c illustrate waveforms for explaining the operation of EPF detection circuit 200. Similar symbols and numerals in FIG. 1 and FIGS. 2a-2c indicate similar items or functions.

Power supply 100 of FIG. 1 includes a conventional full-wave bridge rectifier formed by a rectifier D101 having an anode that is coupled to a terminal 105a of voltage source 105 for rectifying a positive portion Vac1 of voltage Vac of FIG. 2a. A terminal 105b of voltage source 105 of FIG. 1 is coupled to an anode of a rectifier D102 having a cathode that is coupled to the cathode of diode D101 for rectifying a negative portion Vac2 of voltage Vac of FIG. 2a. A junction terminal between the cathodes of rectifiers D101 and D102 of FIG. 1 is coupled to a conventional power supply converter 500, such as a switch mode power supply, not shown in details, that generates supply voltages, some of them not shown, for energizing, for example, a set-top box, not shown. A common or ground terminal 300 of power supply converter 500 is coupled to an anode of a rectifier D104 of the bridge rectifier having a cathode that is coupled to terminal 105b. Ground terminal 300 is coupled to an anode of a rectifier D103 of the bridge rectifier having a cathode that is coupled to terminal 105a.

In EPF detection circuit 200 of FIG. 1, terminal 105a of source 105 is coupled to an anode of a rectifier D406 having a cathode that is coupled to a terminal 110a for rectifying positive portion Vac1 of voltage Vac of FIG. 2a. Terminal 105b of FIG. 1 of voltage source 105 is coupled to an anode of a diode D405 having a cathode that is coupled to junction terminal 110a at the junction of the cathode of diodes D406 and D405 for rectifying negative portion Vac2 of voltage Vac of FIG. 2a. As a result, a full-wave rectified periodic waveform 110b of FIG. 1 is developed at twice the frequency, 60×2=120 Hz, of voltage Vac that is unfiltered with respect to the 60 Hz frequency of AC mains supply voltage Vac. Periodic waveform 110b is coupled via a voltage divider formed by a resistor R401 coupled in series with a resistor R402 to develop at a junction terminal 110c of resistors R401 and R402 a periodic waveform 110d that is the voltage divided portion of waveform 110b.

A capacitor C401 of FIG. 1 that is coupled in parallel with resistor R402 provides high frequency filtering having no effect on periodic waveform 110d because its frequency, 120 Hz, is much lower. A zener diode D401 coupled in parallel with resistor R402 provides overvoltage protection at input terminal 110c of a comparator 400, formed in this case by a shunt regulator integrated circuit TL431 having a threshold level of 2.5V. An output terminal 110e of comparator 400 is coupled to a cathode of a diode D201 of an opto-coupler 112. A resistor R203 coupled in series with diode D201 applies a supply voltage +VDD–IC (in this example 12V) to an anode of diode D201 for producing a current in diode D201 when diode D201 is forward biased. Voltage +VDD–IC is produced by the power supply 500 and can be any convenient voltage.

FIG. 2b illustrates two examples of waveform 110d at different amplitudes, waveform 110d1 and 110d2, in which waveform 110d1 is larger than waveform 110d2. The ratio between the values of resistors R401 and R402 of FIG. 1 is selected so that when voltage Vac of FIG. 2a is at a nominal magnitude of 120V, the instantaneous voltage of waveform 110d1 of FIG. 2b, midway between 0V and the peak voltage of waveform 110d1, is at 2.5V, the threshold level of comparator 400 of FIG. 1.

At time t1 of a given period T of FIG. 2b, waveform 110d1 exceeds and, therefore, crosses the 2.5V threshold of comparator 400 of FIG. 1 in one direction. Consequently, comparator 400 output terminal 110e forms a current path to turn on diode D201 and develop a forward voltage $V_{fw}$ in diode D201 having a rising edge 600 at time t1 of FIG. 2c of the waveform of voltage $V_{fw}$. As a result, transistor Q301 of FIG. 1 of opto-coupler 112 is turned on. A collector voltage at a collector terminal of transistor Q301 will have a transition to approximately 0V. On the other hand, at a time t2 of period T of FIGS. 2a-2c, waveform 110d1 no longer exceeds and, therefore, crosses the 2.5V threshold of comparator 400 of FIG. 1 in the opposite direction. Consequently, comparator 400 output terminal 110e no longer forms a current path to turn off diode D201 and develops forward voltage $V_{fw}$ at 0V across diode D201. Thus, voltage $V_{fw}$ has a falling edge 700 at time t2 of FIG. 2c. As a result, transistor Q301 of FIG. 1 of opto-coupler 112 is turned off. A collector voltage at the collector terminal of transistor Q301 will have a transition to approximately 3.3V by an operation of a pull-up resistor R301. Thus, diode D201 conducts during an interval t1-t2. The 3.3V supply voltage is typical, but can be another voltage that is compatible with the system logic and microprocessor 300.

When, instead of waveform 110d1 of FIG. 2b, waveform 110d2 at the lower amplitude or magnitude is applied, diode D201 of FIG. 1 will conduct during an interval t1'-t2' that is shorter than interval t1-t2. Similarly, a so-called duty cycle of voltage $V_{fw}$ of FIG. 2c is smaller when waveform 110d2 of FIG. 2d at the lower amplitude is applied. The voltage at the collector terminal of transistor Q301 of FIG. 1 is applied to an input of a microprocessor 300 that measures in a conventional manner, for example, the lengths of interval t1-t2 or t1'-t2' of FIG. 2b or, alternatively, the duty cycle of voltage $V_{fw}$ of FIG. 2c by, for example, counting clock cycles, not shown. When the length of interval t1'-t2' of FIG. 2b, for example, is too short, microprocessor 300 will determine that a power failure condition occurs in AC input mains voltage Vac of FIG. 1.

For measuring the length of, for example, interval t1-t2 of FIG. 2b, microprocessor 300 of FIG. 1 counts pulses of, for example, a real time clock, not shown, from time t1, when edge 600 of FIG. 2c occurs to time t2, when edge 700 occurs. Alternatively, microprocessor 300 of FIG. 1 can include an Input-Output (I/O) device, not shown, that acts as an independent clock pulses counter, not shown. In this case, microprocessor 300 of FIG. 1 records or initializes the count number contained in such counter when edge 600 of FIG. 2c occurs and then records the count number contained in such counter when edge 700 occurs. The difference between the count numbers corresponds to the length of the interval t1-t2. Microprocessor 300 of FIG. 1 can calculate the duty cycle of voltage $V_{fw}$ of FIG. 2c by dividing the length of interval t1-t2, as obtained above, by the length of one half of a period which is approximately 8.33 milliseconds for voltage Vac of FIG. 1 having a frequency of 60 Hz.

The magnitude (for example, RMS or peak) of mains supply voltage Vac of FIG. 1 can be obtained by microprocessor 300 using, for example, a look-up table, not shown, containing the corresponding magnitude of voltage Vac for each measured length of interval t1-t2 of FIG. 2b or calculated duty cycle. This look-up table can be obtained by applying known values of voltage Vac of FIG. 1 and measuring the corresponding lengths of interval t1-t2 of FIG. 2b in microprocessor 300 of FIG. 1. Alternatively, this look-up table can be obtained by applying known values of voltage Vac and recording the corresponding calculated duty cycle values of voltage V of FIG. 2c in microprocessor 300 of FIG. 1.

Thus, each of those measurement results is indirectly indicative of a magnitude (for example, RMS or peak) of mains supply voltage Vac of FIG. 1. Based on the indirectly measured magnitude of voltage Vac in given period T of FIG. 2b and possibly based on analyzing measurements during each of several periods T of FIG. 2b, microprocessor 300 of FIG. 1 can provide EPF indication in a manner to initiate and perform orderly power shutdown of the, for example, set-top box, not shown, by, for example, programs interrupt routine. By indirectly measuring the actual magnitude (for example, RMS or peak) of mains supply voltage Vac, controlled shutdown could be initiated, advantageously, at a lower magnitude of the AC mains supply voltage Vac of FIG. 1 than would be required in the prior art. Thus, advantageously, fewer interruptions might occur in the course of operating, for example, the set-top box. By accurately monitoring the magnitude of AC mains supply voltage Vac, it is possible to allow uninterrupted operation, during brown out conditions, when the AC voltage is too small to be within the normal tolerance or range but is greater than what the set-top box that is energized by power supply 500 actually needs for uninterrupted normal operation.

The same power supply 100 of FIG. 1 may be compatible to operate with each of mains supply voltage Vac of 110V, 60 Hz and mains supply voltage Vac of 230V, 50 Hz. As explained before, microprocessor 300 can measure the length period T of FIG. 2b to determine whether supply voltage Vac is at 60 Hz or at 50 Hz. This, advantageously, allows for separate look-up tables to be used in the same system for voltage Vac at 60 Hz and for voltage Vac at 50 Hz, respectively, to further optimize the decision of when to initiate the shutdown routine. For example, when supply voltage Vac is at 50 Hz, the period T might be longer than when it is at 60 Hz. For the purpose of insuring that the output supply voltage of power supply 100 of FIG. 1 will not excessively decrease, during a disturbance, microprocessor 300 might initiate the shutdown routine at a higher voltage Vac than when supply voltage Vac is at 60 Hz.

With a specific AC voltage Vac applied during factory testing, the duty-cycle or length of interval t1-t2 of FIG. 2b can be preset to account for the forward drops in the rectifier diodes, etc. to further add to the precision of the voltage detector threshold. The alignment value could be stored in Flash or Eeprom non-volatile memory, not shown. A software algorithm would be used to set the minimum required threshold voltage to guarantee the required shutdown time.

The invention claimed is:

1. A method, performed by an electrical circuit in an electronic device, for providing an early power failure (EPF) indication for the electronic device energized by an alternating current (AC) input mains voltage, the method comprising:
 applying the AC input mains voltage to a full wave bridge rectifier coupled to a voltage divider that is coupled to a threshold detector of the electronic device, wherein the threshold detector reacts to a positive threshold voltage to activate an opto-coupled transistor to provide a pulse to a processor when the positive threshold voltage is exceeded;
 measuring, by the processor, a duration of the pulse, which is indicative of a length of time of a corresponding portion of a period of the AC input mains voltage, when, during the period portion, an instantaneous magnitude of the AC input mains voltage exceeds the positive threshold voltage; and
 providing, by the processor, the EPF indication in accordance with the length of time of the pulse, wherein the EPF indication initiates and the processor performs an orderly power shutdown of the electronic device.

2. The method of claim 1, wherein the measuring is performed by counting clock cycles occurring between a time when the AC input mains voltage crosses a threshold level of the threshold detector in one direction and a time when the AC input mains voltage crosses a threshold level in a direction opposite to the one direction.

3. The method of claim 1 further comprising rectifying the AC input mains voltage producing a full wave rectified voltage that is unfiltered with respect to a frequency of the AC input mains voltage wherein the rectified voltage is applied to an input of the threshold detector.

4. The method of claim 1 wherein providing the EPF indication comprises providing the EPF indication when a duty cycle of the duration of the pulse is outside a normal operation range.

5. The method of claim 1, further comprising initiating a shutdown routine in a processor of the electronic device when the EPF indication is provided.

6. The method of claim 1 wherein providing the EPF indication is based on durations of pulses measured in more than one measuring step associated with corresponding periods of the AC input mains voltage.

7. An apparatus for generating an early power failure (EPF) indicative signal for an electronic device energized by an alternating current (AC) input mains voltage, the apparatus comprising:
 a threshold detector responsive to the AC input mains voltage coupled to a full wave bridge rectifier, the threshold detector generating an output signal when, during a portion of a period of the AC input mains voltage, an instantaneous magnitude of the AC input mains voltage exceeds a positive voltage threshold of the threshold detector; and
 a processor configured to measure a value indicative of a length of the portion period of the detector output signal and for providing the EPF indication in accordance with the length indicative value;
 wherein the threshold detector activates an opto-coupled transistor to provide a pulse to the processor when the instantaneous magnitude of the AC input mains voltage exceeds the positive voltage threshold;
 wherein the processor is configured to initiate and perform an orderly power shutdown of the electronic device based on a length of time of the pulse.

* * * * *